US012604587B2

(12) United States Patent
Wei et al.

(10) Patent No.: US 12,604,587 B2
(45) Date of Patent: Apr. 14, 2026

(54) BACKLIGHT MODULE AND DISPLAY DEVICE

(71) Applicant: HKC CORPORATION LIMITED, Shenzhen (CN)

(72) Inventors: Guangping Wei, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 377 days.

(21) Appl. No.: 18/231,733

(22) Filed: Aug. 8, 2023

(65) Prior Publication Data

US 2024/0395998 A1     Nov. 28, 2024

(30) Foreign Application Priority Data

Feb. 28, 2023     (CN) .......................... 202310176628.6

(51) Int. Cl.
  *H10H 20/858*     (2025.01)
  *H10H 20/831*     (2025.01)
  *H10H 29/14*     (2025.01)

(52) U.S. Cl.
  CPC ...... *H10H 20/8586* (2025.01); *H10H 20/831* (2025.01); *H10H 29/142* (2025.01)

(58) Field of Classification Search
  CPC . H10H 20/8586; H10H 20/831; H10H 29/142
  See application file for complete search history.

(56) References Cited

U.S. PATENT DOCUMENTS

| | | | |
|---|---|---|---|
| 2002/0155640 A1 | 10/2002 | Wu | |
| 2009/0231881 A1 | 9/2009 | Shibata et al. | |
| 2011/0154833 A1 | 6/2011 | Chao et al. | |
| 2011/0272575 A1 | 11/2011 | Kim et al. | |
| 2013/0235611 A1 | 9/2013 | Franklin et al. | |
| 2016/0120019 A1* | 4/2016 | Shedd ..................... | F25B 41/40 |
| | | | 361/679.47 |
| 2018/0221871 A1 | 8/2018 | Roberts et al. | |
| 2019/0212543 A1 | 7/2019 | Li | |

(Continued)

FOREIGN PATENT DOCUMENTS

| | | |
|---|---|---|
| CN | 101360412 A | 2/2009 |
| CN | 101374397 A | 2/2009 |

(Continued)

*Primary Examiner* — Jonathan Han

(57)     ABSTRACT

A backlight module and a display device are disclosed. The backlight module includes a light board and a heat dissipation structure. Multiple light-emitting elements are arranged in a matrix on the light board. The heat dissipation structure includes a first control layer arranged on a side of the light board facing away from the light-emitting elements, and a second control layer opposite to the first control layer. There is a gap between the first control layer and second control layer, and there is disposed a coolant droplet in the gap. When a light-emitting element satisfies a first heating condition, the first control layer and second control layer control a coolant droplet to move to a position underneath the light-emitting element. When the light-emitting element satisfies a second heating condition, the first control layer and second control layer control the coolant droplet to leave the position underneath the light-emitting element.

19 Claims, 5 Drawing Sheets

(56) References Cited

U.S. PATENT DOCUMENTS

| | | | |
|---|---|---|---|
| 2021/0060556 | A1 | 3/2021 | Yao et al. |
| 2021/0280761 | A1 | 9/2021 | Kim et al. |
| 2023/0099295 | A1* | 3/2023 | Shahriari ............. H01L 23/473 |
| | | | 359/228 |

FOREIGN PATENT DOCUMENTS

| | | | |
|---|---|---|---|
| CN | 102628566 | A | 8/2012 |
| CN | 106125293 | A | 11/2016 |
| CN | 107649223 | A | 2/2018 |
| CN | 108710201 | A | 10/2018 |
| CN | 112669717 | A | 4/2021 |
| CN | 112670256 | A | 4/2021 |
| CN | 114994986 | A | 9/2022 |
| CN | 115209705 | A | 10/2022 |
| TW | 200926947 | A | 6/2009 |
| WO | 2020244120 | A1 | 12/2020 |

* cited by examiner

BACKLIGHT MODULE AND DISPLAY DEVICE

CROSS-REFERENCE TO RELATED APPLICATIONS

This application claims the priority and benefit of Chinese patent application number 2023101766286, titled "Backlight Module and Display Device" and filed Feb. 28, 2023 with China National Intellectual Property Administration, the entire contents of which are incorporated herein by reference.

TECHNICAL FIELD

The present application relates to the field of display technology, and more particularly relates to a backlight module and a display device.

BACKGROUND

The description provided in this section is intended for the mere purpose of providing background information related to the present application but doesn't necessarily constitute prior art.

As the light-emitting diodes of a mini LED display are designed with more and more partitions, the numbers of LED light-emitting diodes and chips are also becoming more and more. The mini LED light-emitting diodes in a high-brightness partition have high power, high brightness, and significant heat generation, which may locally heat the display panel and cause color shift of the display panel.

Nowadays, the heat dissipation of the light-emitting diodes may be carried out by adding a cooling fan or cooling holes for the light-emitting diodes, or designing a heat dissipation structure on the surface of the light-emitting diodes. However, these heat dissipation methods are all passive heat dissipation, which cannot discharge the high-density heat generated by a local position of the LED chip or a single mini LED light-emitting element in a short period of time. Furthermore, the heat dissipation method with the fixed structure is also unable to quickly cool down in a localized and targeted manner the mini LED display having an uneven heat generation structure.

Therefore, how to quickly cool down the local heat generated by mini LEDs in a relatively short period of time has become an urgent problem in this field.

SUMMARY

In view of the above, it is therefore one purpose of the present application to provide a backlight module and a display device, which can quickly cool down the local heat generated by mini LEDs in a relatively short period of time.

The application discloses a backlight module. The backlight module includes a light board and a heat dissipation structure. A plurality of light-emitting elements are arranged in a matrix on the light board. The heat dissipation structure is arranged on the side of the light board facing away from the light emitting units. The heat dissipation structure includes a first control layer and a second control layer. The first control layer is arranged on the side of the light board facing away from the light-emitting elements, and is arranged opposite to the second control layer. There is a gap between the first control layer and the second control layer, and there is disposed a coolant droplet in the gap. When a light-emitting element satisfies a first heating condition, the first control layer and the second control layer control the coolant droplet to move to a position underneath the light-emitting element. When the light-emitting element satisfies a second heating condition, the first control layer and the second control layer control the coolant droplet to leave the position underneath the light-emitting element.

In some embodiments, the first control layer includes a first hydrophobic layer and a first control electrode layer stacked in sequence, and the second control layer includes a substrate, a second control electrode layer, and a second hydrophobic layer stacked in sequence. The second control electrode layer includes a plurality of second control electrodes, each of the second control electrodes corresponds to the position of each of the light-emitting elements; and when a voltage difference is formed between each of the second control electrodes and the first control electrode layer, the positions of the first hydrophobic layer and the second hydrophobic layer corresponding to the second control electrodes are both hydrophilic, and when a zero voltage is formed between each of the second control electrodes and the first control electrode layer If not, both the first hydrophobic layer and the second hydrophobic layer are hydrophobic at positions corresponding to the second control electrode.

In some embodiments, the heat dissipation structure further includes a low-temperature coolant storage region, a high-temperature coolant storage region, and a cooling device. The low-temperature coolant storage region and the high-temperature coolant storage region are respectively arranged on different sides of the first control layer and the second control layer. The low-temperature coolant storage region, the high-temperature coolant storage region, and the cooling device are connected by cooling pipes. The cooling pipe is equipped with a one-way valve to control the flow of the coolant in the high-temperature cooling storage region to the low-temperature coolant storage region. The low-temperature coolant storage region defines a plurality of first through holes corresponding to the gap between the first control layer and the second control layer. The high-temperature coolant storage region defines a plurality of second through holes corresponding to the gap between the first control layer and the second control layer. The position of each of the first through hole and the second through hole corresponds to the position of the second control electrode in each row or column. The orientation in which the low-temperature coolant storage region is located is the first orientation, the orientation in which the high-temperature coolant storage region is located is the second orientation, and the first control electrode layer and the second control electrode layer control the coolant droplet to move from the first orientation to the second orientation.

In some embodiments, the second control electrodes further include a first electrode and a second electrode. The first electrode is arranged in the low-temperature coolant storage region at a position adjacent to each first through hole. The second electrode is arranged in the high-temperature coolant storage region at a position adjacent to each second through hole. The orthographic projection of the first control electrode layer in the direction perpendicular to the substrate covers the orthographic projections of the first electrode and the second electrode in the direction perpendicular to the substrate.

In some embodiments, the low-temperature coolant storage region and the high-temperature coolant storage region are adjacent to each other. The second control electrodes further include a plurality of third electrodes disposed above the substrate, and the plurality of third electrodes are arranged in an L shape between the first electrode and the second electrode.

In some embodiments, the low-temperature coolant storage region and the high-temperature coolant storage region are oppositely arranged. The second control electrodes further include a plurality of third electrodes disposed above the substrate, and the plurality of third electrodes are arranged in a straight line between the first electrode and the second electrode.

In some embodiments, there is a coolant droplet between each of the second control electrodes and each of the light emitting units. When one light-emitting element reaches the second heat-generating condition from the first heat-generating condition, the voltage difference between the first control electrode layer and the second control electrode underneath the light-emitting element meeting the second heat-generating condition is Zero, and there is generated a voltage difference between each of the adjacent multiple second control electrodes arranged sequentially from the first orientation to the second orientation and the first control electrode layer at equal time intervals.

In some embodiments, the coolant droplet is only placed under the light-emitting element that meets the first heating condition. When the light-emitting element reaches the second heat-generating condition from the first heat-generating condition, there is generated a voltage difference between each of the plurality of second control electrodes arranged sequentially from the position of the light-emitting element under the second heating condition to the second orientation and the first control electrode layer at equal time intervals.

In some embodiments, a plurality of adjacently arranged light-emitting elements form one light-emitting region. There is disposed a coolant droplet between each light-emitting region and the plurality of second control electrodes corresponding to the light-emitting region, where an area of the coolant droplet is equal to an area of the light-emitting region. When one of the light emitting regions reaches the second heating condition from the first heating condition, the voltage difference between the first control electrode layer and the second control electrodes under the light emitting region reaching the second heating condition is zero, and there is generated a voltage difference between the second control under each of the adjacent light-emitting regions sequentially arranged from the first orientation to the second orientation at equal time intervals.

The present application further discloses a display device, which includes a display panel. The display device further includes the above-mentioned backlight module, and the display panel is arranged on a side of a light-emitting surface of the backlight module.

In this application, the heat dissipation structure is arranged under the light board, and the first control layer and the second control layer of the heat dissipation structure are used to control the movement of the coolant droplets located between the first control layer and the second control layer. When the light-emitting elements satisfy the first heating condition, the first control layer and the second control layer control the coolant droplets to move to a position underneath the light-emitting elements. At this time, the coolant droplets will absorb the heat generated by the light emitting units, and reduce the temperature of the light emitting units 111 to the second heating condition. When the light-emitting element satisfies the second heating condition, the first control layer and the second control layer 125 control the coolant droplet to leave under the light-emitting element, and the heat is taken away by the coolant droplet. In this way, it is possible to dissipate heat from the light-emitting element by controlling the stay or replenishment of the coolant droplets under the high-heat-generating light-emitting element, which can control the temperature uniformity of the backlight, prevent local overheating of the backlight, and quickly cool down the local heat generated by the mini LED in a relatively short period of time.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
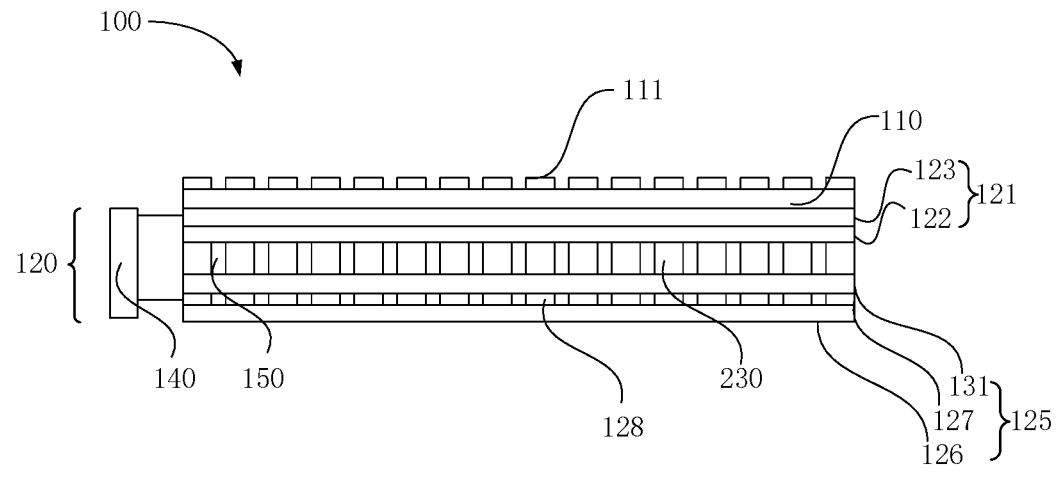
FIG. 1 is a schematic diagram of an embodiment of the backlight module according to the present application.

In the drawings: 10, display device; 100, backlight module; 300, display panel; 110, light board; 111, light-emitting element; 120, heat dissipation structure; 121, first control layer; 122, first hydrophobic layer; 123, first control electrode layer; 125, second control layer; 126, substrate; 127, second control electrode layer; 128, second control electrode; 129, first electrode; 130, second electrode; 131, second hydrophobic layer; 131, second hydrophobic layer; 132, third electrode; 140, driver chip; 150, support column; 160, low-temperature coolant storage region; 170, high-temperature coolant storage region; 180, first through hole; 181, second through hole; 190, cooling device; 200, cooling pipe; 210, one-way valve; 220, light-emitting region; 230, coolant drop.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

Hereinafter this application will be described in further detail with reference to the accompanying drawings and some optional embodiments.

FIG. 1 is a schematic diagram of an embodiment of a backlight module of the present application. This application discloses a backlight module 100. The backlight module 100 includes a light board 110 and a heat dissipation structure 120. A plurality of light emitting units 111 are arranged in a matrix on the light board 110. The heat dissipation structure 120 is arranged on a side of the light board 110 facing away from the light emitting units 111. The heat dissipation structure 120 includes a first control layer 121 and a second control layer 125. The first control layer 121 is disposed on the side of the light board 110 facing away from the light-emitting element 111 and is disposed opposite to the second control layer 125. There is defined a gap between the first control layer 121 and the second control layer 125, and there are disposed coolant droplets 230 in the gap. When the light-emitting elements 111 satisfy a first heating condition, the first control layer 121 and the second control layer 125 control the coolant droplets 230 to move to a position underneath the light-emitting element 111. When the light emitting units 111 satisfy the second heating condition, the first control layer 121 and the second control layer 125 control the coolant droplet 230 to leave the position underneath the light emitting unit 111.

In this application, the heat dissipation structure 120 is arranged under the light board 110, and the first control layer 121 and the second control layer 125 of the heat dissipation structure 120 are used to control the movement of the coolant droplets 230 located between the first control layer 121 and the second control layer 125. When the light-emitting elements 111 satisfy the first heating condition, the first control layer 121 and the second control layer 125 control the coolant droplets 230 to move to a position underneath the light-emitting elements 111. At this time, the coolant droplets 230 will absorb the heat generated by the light emitting units 111, and reduce the light emitting units 111 from the first heating condition to the second heating condition. When the light-emitting element 111 satisfies the second heating condition, the first control layer 121 and the second control layer 125 control the coolant droplet 230 to leave under the light-emitting element 111, and the heat is taken away by the coolant droplet 230. In this way, it is possible to dissipate heat from the light-emitting element 111 by controlling the stay or replenishment of the coolant droplets 230 under the high-heat-generating light-emitting element 111, which can control the temperature uniformity of the backlight, prevent local overheating of the backlight, and quickly cool down the local heat generated by the mini LED in a relatively short period of time.

It should be noted that the first heating condition mentioned in this application refers to the high temperature reached by the light emitting unit 111 in a short time, and the second heating condition refers to the temperature of the light emitting unit 111 in a normal state. Studies have shown that the service life of a mini LED is 20 times longer when the working environment temperature is 30° C. than at 70° C. Therefore, the range of the first heating condition can be set but not limited to 60° C. to 80° C., which belongs to the high temperature range reached by the light emitting unit 111 in a short time, and the range of the second heating condition is 20° C. to 40° C., which belongs to the temperature range of the light-emitting element 111 under normal conditions. Of course, this application merely uses exemplary data to explain the relationship between the first heating condition and the second heating condition for the mere purpose of ease of understanding. The actual temperature ranges of the first heating condition and the second heating condition can be set according to actual conditions during the actual use of the backlight module 100.

In addition, this application is different from the method of heat dissipation targeted at local areas of mini LEDs, but can perform only point-to-point precise heat dissipation for specific one or more light-emitting elements 111 reaching a high temperature in a short period of time.

Specifically, the first control layer 121 includes a first hydrophobic layer 122 and a first control electrode layer 123 stacked in sequence. The second control layer 125 includes a substrate 126, a second control electrode layer 127 and a second hydrophobic layer 131 stacked in sequence. The second control electrode layer 127 includes a plurality of second control electrodes 128, and each second control electrode 128 corresponds to the position of each light emitting unit 111. The heat dissipation structure 120 further includes a driver chip 140. The second control electrode layer 127 and the first control electrode layer 123 are both electrically connected to the driver chip 140. The driver chip 140 controls to form a voltage difference or zero voltage difference between each second control electrode 128 and the first control electrode layer 123. When a voltage difference is formed between each second control electrode 128 and the first control electrode layer 123, the position of the first hydrophobic layer 122 and the position of the second hydrophobic layer 131 corresponding to the second control electrode 128 are both hydrophilic. When a zero voltage difference is formed between each second control electrode 128 and the first control electrode layer 123, the position of the first hydrophobic layer 122 and the position of the second hydrophobic layer 131 corresponding to the second control electrode 128 are both hydrophobic.

Both the first control electrode layer 123 and the second control electrode layer 127 are electrically connected to the driver chip 140. The heat dissipation structure 120 per se can be provided with the driver chip 140 to control the first control electrode layer 123 and the second control electrode layer 127. Alternatively, the electrical properties of the first control electrode layer 123 and the second control electrode layer 127 can also be controlled by an external driver chip 140, so that a voltage difference or zero voltage difference is formed between the second control electrode 128 and the first control electrode layer 123.

The size of the second control electrode 128 can be set according to the size of the light emitting unit 111 or the partition size of the light emitting region 220. The second control electrode 128 can be square or other shapes, such as circle, rhombus, etc. Furthermore, the shapes of the second control electrodes 128 in one heat dissipation structure 120 can include not only one shape, but also a combination of multiple shapes of second control electrodes 128, where the specific combination can be designed according to specific requirements.

The first hydrophobic layer 122 and the second hydrophobic layer 131 make the coolant droplet 230 meet the hydrophobic state or the hydrophilic state through the electrical change between the first control electrode layer 123 and the second control electrode 128, and by controlling the hydrophilicity and hydrophobicity of the coolant droplet 230 through the change of the electric property between the first control electrode layer 123 and the second control electrode 128, the coolant droplet 230 is controlled to flow. That is, when the voltage difference between the first control electrode layer 123 and the second control electrode 128 is zero, the coolant droplet 230 is hydrophobic at the position of the first hydrophobic layer 122 and the second hydrophobic layer 131 corresponding to the second control electrode 128. At this time, the coolant droplet 230 will flow between the first hydrophobic layer 122 and the second hydrophobic layer 131. When the voltage difference between the first control electrode layer 123 and the second control electrode 128 is not zero, the coolant droplet 230 is hydrophilic at the position where the first hydrophobic layer 122 and the second hydrophobic layer 131 correspond to the second control electrode 128. At this time, the coolant droplet 230 will be fixed between the first hydrophobic layer 122 and the second hydrophobic layer 131 in a manner similar to "sticking". When two adjacent second control electrodes 128 meet the voltage difference and zero voltage difference respectively, the coolant droplet 230 will move from the position of the second control electrode 128 satisfying the zero voltage difference to the second control electrode 128 having the voltage difference. That is, the movement of the coolant droplet 230 from one light emitting unit 111 to another light emitting unit 111 is created.

The coolant mainly used for heat dissipation may be a coolant, or a liquid metal or liquid alloy. The coolant droplet 230 is placed on the surface between the first hydrophobic layer 122 and the second hydrophobic layer 131. When the driver chip 140 is not powered on, the coolant droplet 230 is in a hydrophobic state, and when the power is on, the liquid droplet is in a hydrophilic state. The behavior of the coolant droplet 230 can be controlled by changing between the hydrophilic and hydrophobic states of the coolant droplet 230.

Further, as shown in FIG. 1, a support column 150 is further disposed between the first hydrophobic layer 122 and the second hydrophobic layer 131. One end of the support column 150 abuts against the first hydrophobic layer 122, and the other end abuts against the second hydrophobic layer 131. The support column 150 supports the first hydrophobic layer 122 and the second hydrophobic layer 131 to form a gap, and the support column 150 is made of a polymer material. The support column 150 can be made of a polymer material similar to the spacer column inside the display panel 300, and fabricated in the heat dissipation structure 120 by photolithography, so as to support between the first hydrophobic layer 122 and the second hydrophobic layer 131 to form a stable cell structure, so that the coolant droplet 230 can move more easily without being hindered, further ensuring the cooling effect of the coolant droplet 230.

Figure 2:
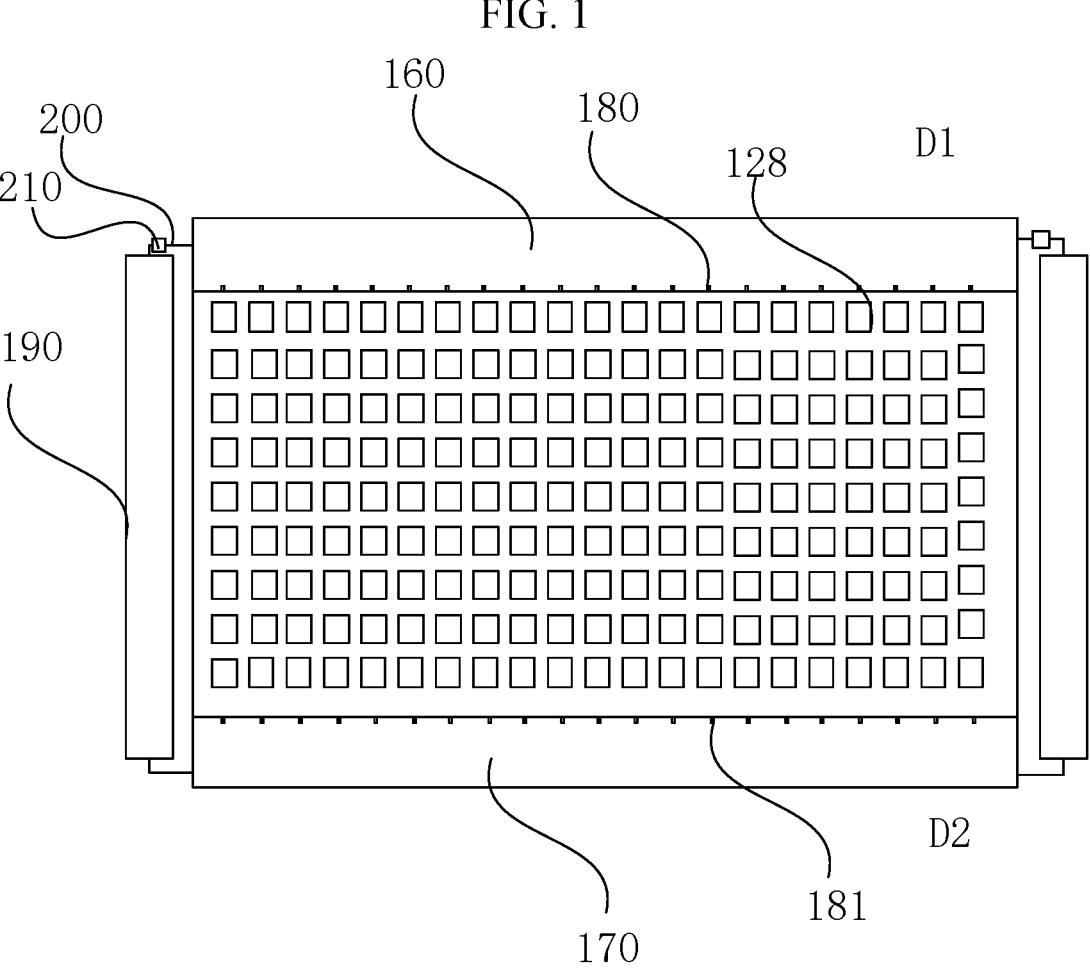
FIG. 2 is a top view of a first embodiment of a heat dissipation structure in a backlight module according to the present application.

FIG. 2 is a top view of a first embodiment of the heat dissipation structure in the backlight module of the present application. As shown in FIG. 2, the heat dissipation structure 120 further includes a low-temperature coolant storage region 160, a high-temperature coolant storage region 170 and a cooling device 190. The low-temperature coolant storage region 160 and the high-temperature coolant storage region 170 are respectively arranged on different sides of the first control layer 121 and the second control layer 125. The low-temperature coolant storage region 160, the high-temperature coolant storage region 170, and the cooling device 190 are connected together by a cooling pipe 200. The cooling pipe 200 is equipped with a one-way valve 210 to control the flow of the coolant in the high-temperature coolant storage region 170 to the low-temperature coolant storage region 160. The low-temperature coolant storage region 160 defines a plurality of first through holes 180 corresponding to the gap between the first control layer 121 and the second control layer 125. The high-temperature coolant storage region 170 defines a plurality of second through holes 181 corresponding to the gap between the first control layer 121 and the second control layer 125. The position of each first through hole 180 and second through hole 181 corresponds to the position of the second control electrode 128 in each row or column. The orientation where the low-temperature coolant storage region 160 is located is the first orientation D1, and the orientation where the high-temperature coolant storage region 170 is located is the second orientation D2. The first control electrode layer 123 and the second control electrode layer 127 control the coolant droplet 230 to move from the first orientation D1 to the second orientation D2.

The low-temperature coolant storage region 160 in this application is used to store the coolant at a normal temperature. The high temperature coolant storage region 170 is used to store the coolant that has absorbed the heat of the light emitting unit 111. The cooling device 190 is connected to each of the low-temperature coolant storage region 160 and the high-temperature coolant storage region 170 through the cooling pipe 200, and is used to cool the coolant in the high-temperature coolant storage region 170 and transfer it to the low-temperature coolant storage region 160. The one-way valve 210 of the cooling pipe 200 may be a Tesla one-way valve or other one-way valve structures.

In order to better control the flow of coolant in the low-temperature coolant storage region 160 and the high-temperature coolant storage region 170, the aperture ranges of the first through hole 180 and the second through hole 181 are both set between 50 μm and 100 μm. For example, when the diameters of the first through hole 180 and the second through hole 181 are each 70 μm, since the diameters of the first through hole 180 and the second through hole 181 are relatively small, the coolant in the low-temperature coolant storage region 160 and the high-temperature coolant storage region 170 will not flow from the first through hole 180 and the second through hole 181 in a natural state due to the surface tension of the liquid.

Taking the first through holes 180 of the low temperature coolant storage region 160 as an example, when the second control electrode 128 near the first through hole 180 and the first control electrode layer 123 are not energized, the coolant droplets 230 in the low-temperature coolant storage region 160 will not flow out due to the surface tension of the liquid. When the second control electrode 128 near the first through hole 180 and the first control electrode layer 123 are energized, the hydrophilicity of the corresponding position of the second hydrophobic layer 131 above the second control electrode 128 is enhanced, so the coolant in the low-temperature coolant storage region 160 will flow out from the first through hole 180 of the low-temperature coolant storage region 160 onto the second hydrophilic control electrode 128, and then the driver chip 140 controls the electrical properties of the adjacent second control electrode 128 to guide the coolant droplet 230 to flow.

Specifically, as shown in FIG. 1 in conjunction with FIG. 2, there is disposed a coolant droplet 230 between each second control electrode 128 and each light emitting unit 111. When a light-emitting element 111 reaches the second heat-generating condition from the first heat-generating condition, the voltage difference between the first control electrode layer 123 and the second control electrode 128 underneath the light-emitting element 111 meeting the second heat-generating condition is zero. Furthermore, there is generated a voltage difference between each of a plurality of adjacent second control electrodes 128 sequentially arranged from the first orientation D1 to the second orientation D2 and the first control electrode layer 123 at equal time intervals.

The specific working principle is: when the backlight module 100 starts to work, the driver chip 140 supplies power to the first control electrode layer 123 and the second control electrode layer 127, and controls the voltage output by timing to drive and change the voltages of the second control electrodes 128 an time intervals, so that the coolant droplet 230 flows out from the first through hole 180 of the low-temperature coolant storage region 160, and reaches the position under each light emitting unit 111 according to the preset flow route. The coolant droplet 230 stays at the position of the light emitting unit 111 for a period of time to absorb heat (the staying time can be preset, controlled by the timing of the driver chip 140), and the coolant droplet 230 absorbs heat to cool down the light emitting unit 111 meeting the first heating condition to the second heating condition, and then moves to the high-temperature coolant storage region 170 according to a preset route.

For example, in a column of continual multiple coolant drops 230, when the first coolant drop 230 leaves the position of the light-emitting element 111 that has dropped to the second heat-generating condition, a second drop of coolant 230 will replenish to the position of the first drop of coolant 230 within a certain period of time to dissipate heat from the light-emitting element 111, and this cycle repeats, so that continuous and effective heat dissipation can be performed on each light emitting unit 111 on the light board 110. It is also possible to dissipate heat from the light-emitting element 111 by controlling the stay or replenishment of cooling droplet 230 under the high-heat-generating light-emitting element 111, so that the temperature uniformity of the backlight can be controlled, local overheating of the backlight can be prevented, and the local heat generated by the mini LED can be rapidly cooled in a relatively short period of time.

Through the placement design of the second control electrodes 128 and the timing setting of the second control electrodes 128, the coolant or coolant metal alloy in amounts of mL, uL or even pL can be moved according to the specified route. Furthermore, the driver chip 140 may apply voltages to the second control electrode 128 and the first control electrode layer 123 at different times to complete operations such as merging and splitting on the cooling droplets 230.

Further, both the first control electrode layer 123 and the second control electrode 128 are made of conductive metal materials, such as Cu, Au, Ag, Al, etc. The metal used for the first control electrode layer 123 may have good thermal conductivity, which can further improve the heat dissipation effect on the light emitting unit 111. In addition, the driver chip 140 can control the voltage change between the first control electrode layer 123 and the second control electrode 128 relatively quickly to control the movement of the coolant droplet 230, so that the coolant droplet 230 is moved relatively quickly to the position under the light emitting unit 111 that needs to be cooled, or the coolant droplet 230 that has absorbed enough heat to cool the high-temperature light-emitting element 111 to normal temperature is moved away from the target light-emitting element 111. Through the continuous replenishment and stay of the coolant droplets 230, a large amount of heat generated by the light emitting unit 111 is taken away, which can control the temperature uniformity of the backlight, prevent local overheating of the backlight, and quickly cool down the local heat generated by the mini LED in a relatively short period of time.

Figures 3, 4:
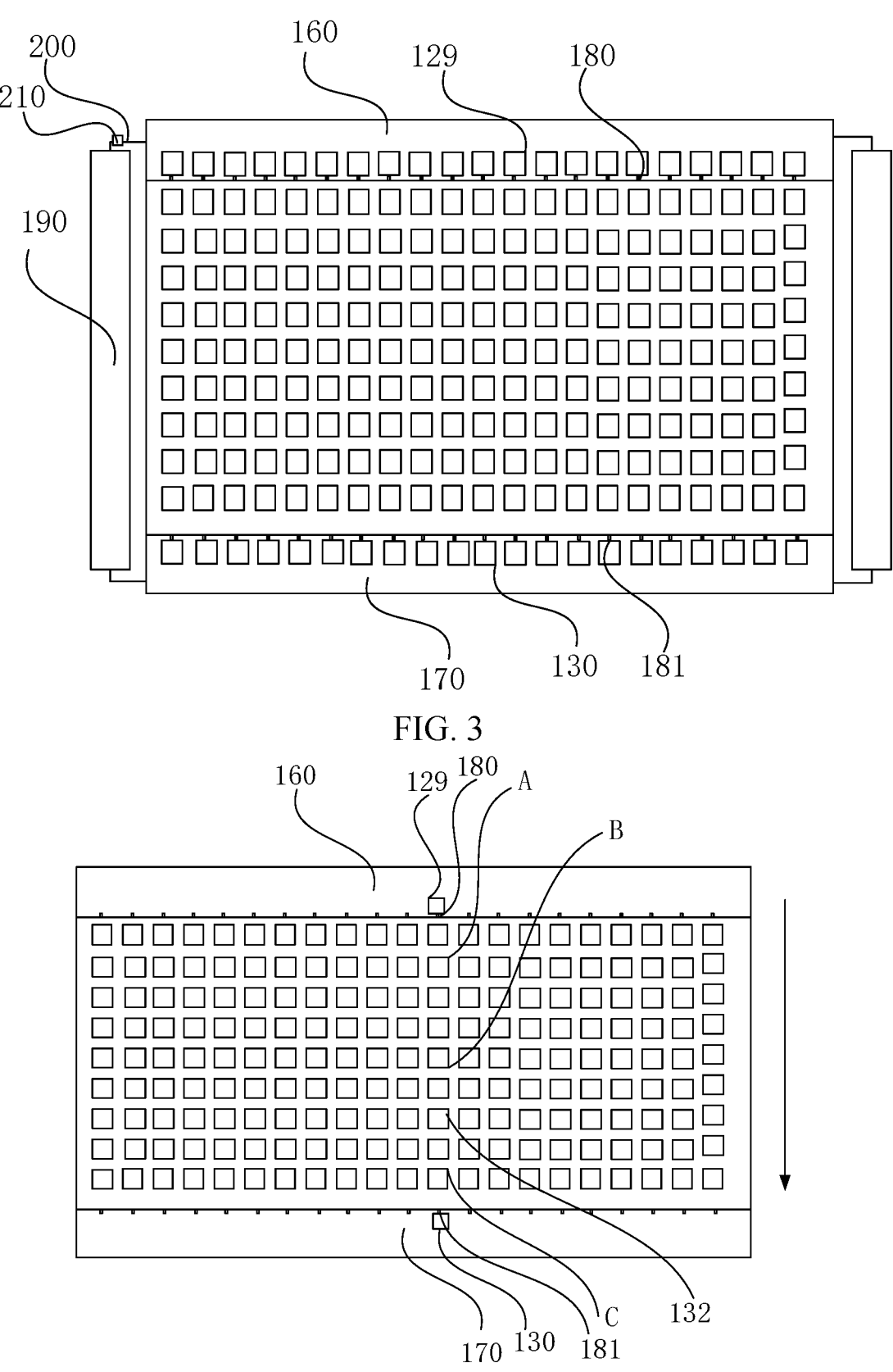
FIG. 3 is a top view of a second embodiment of the heat dissipation structure in the backlight module according to the present application.
FIG. 4 is a top view of a third embodiment of the heat dissipation structure in the backlight module according to the present application.
Figure 7:
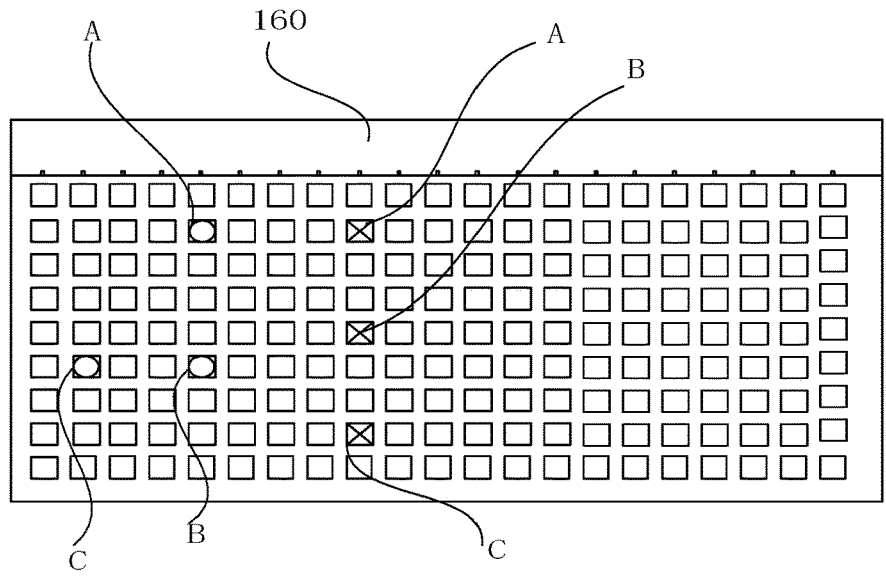
FIG. 7 is a schematic diagram of an operating state at a certain moment during an operating process of the heat dissipation structure according to the present application.

FIG. 3 is a schematic diagram of a second embodiment of a heat dissipation structure in the backlight module of the present application. As shown in FIG. 7, the second control electrode 128 further includes a first electrode 129 and a second electrode 130. The first electrode 129 is disposed in the low-temperature coolant storage region 160 at a position adjacent to each first through hole 180. The second electrode 130 is disposed in the high-temperature coolant storage region 170 at a position adjacent to each second through hole 181. The orthographic projection of the first control electrode layer 123 in the direction perpendicular to the substrate 126 covers the orthographic projections of the first electrode 129 and the second electrode 130 in the direction perpendicular to the substrate 126.

That is, the first electrode 129 and the second electrode 130 are respectively arranged in the low-temperature coolant storage region 160 and the high-temperature coolant storage region 170 near the first through hole 180 and the second through hole 181, and at the position of the first through hole 180, the coolant is divided by changing the electrical properties of the first electrode 129, so that the coolant actively flows out in the form of droplets, and the coolant droplets 230 can flow out from the coolant storage region more uniformly, and by changing the electrical property of the second electrode 130 at the position of the second through hole 181, the coolant droplet 230 flowing toward the high temperature coolant storage region 170 enters the second through hole 181 and reaches the high temperature coolant storage region 170 more easily.

After the coolant drop 230 flows out from the low-temperature coolant storage region 160, after absorbing the heat of the light-emitting element 111, it flows into the high-temperature coolant storage region 170. The flow direction of the coolant droplets 230 is mainly determined by the installation positions of the low-temperature coolant storage region 160 and the high-temperature coolant storage region 170. For a better explanation, this application provides the following exemplary descriptions:

FIG. 4 is a top view of a third embodiment of the heat dissipation structure in the backlight module of the present application. As shown in FIG. 3, A is a coolant droplet 230 that has not reached the heat dissipation position after flowing out of the low-temperature coolant storage region 160; B is the coolant droplet 230 that is absorbing heat at the designated position; The coolant droplet 230 after absorbing heat (heat saturation state) is moving towards the high-temperature coolant storage region 170.

The low-temperature coolant storage region 160 and the high-temperature coolant storage region 170 are oppositely arranged. The second control electrode 128 further includes a plurality of third electrodes 132 disposed above the substrate 126, and the plurality of third electrodes 132 are arranged in a straight line between the first electrode 129 and the second electrode 130.

The coolant in the low-temperature coolant storage region 160 is first actively divided by the first electrode 129 to form a coolant droplet 230, which flows out from the first through hole 180, and moves under the control of multiple third electrodes 132 to the position under the light emitting unit 111 that meets the first heating condition to stay and absorb heat. When the temperature of the light-emitting element 111 drops to the second heating condition, multiple third electrodes 132 control the coolant droplet 230 to leave the light-emitting element 111 and move toward the direction of the second through hole 181 until it enters the high-temperature coolant storage region 170 through the second through hole 181. The entire moving track of the coolant droplet 230 is a straight line.

Figure 5:
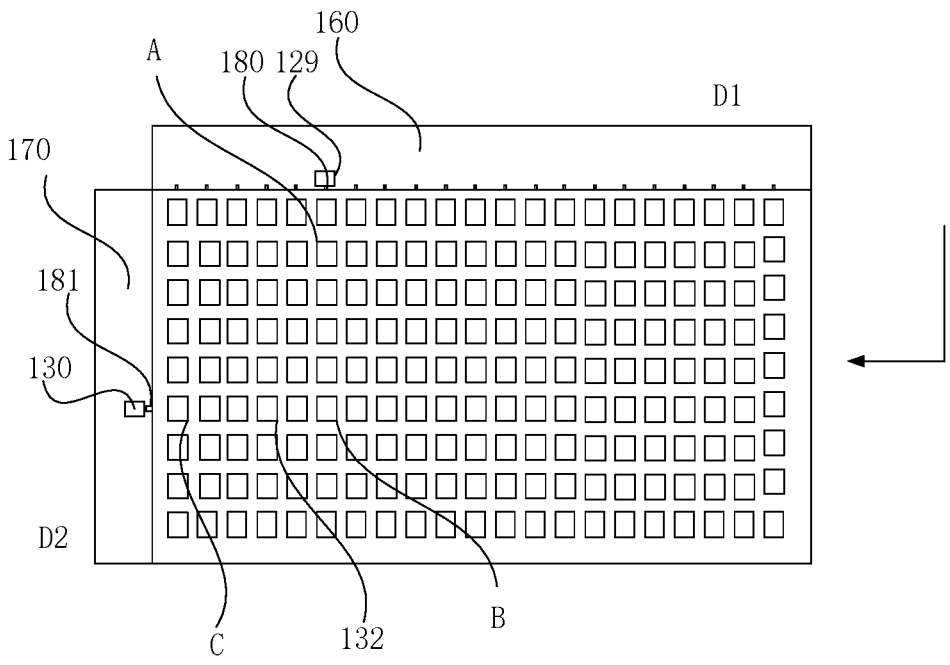
FIG. 5 is a top view of a fourth embodiment of the heat dissipation structure in the backlight module according to the present application.

FIG. 5 is a top view of a fourth embodiment of the heat dissipation structure in the backlight module of the present application. As shown in FIG. 4, A is a coolant drop 230 that is moving and that has not reached the cooling position after flowing out from the low-temperature coolant storage region 160; B is a coolant drop 230 that has arrived at the designated position is absorbing heat at the designated position; C is a coolant drop 230 that has absorbed heat (heat saturated state) at the designated position, and is moving to the high-temperature coolant storage region 170.

The low-temperature coolant storage region 160 and the high-temperature coolant storage region 170 are adjacently arranged. The second control electrodes 128 further include a plurality of third electrodes 132 disposed above the substrate 126, and the plurality of third electrodes 132 are arranged in an L shape between the first electrode 129 and the second electrode 130.

The coolant in the low-temperature coolant storage region 160 is first actively divided by the first electrode 129 to form a coolant droplet 230, which flows out from the first through hole 180. The coolant droplet 230 then moves under the control of a plurality of third electrodes 132, to the position under the light-emitting element 111 that meets the first heating condition to stop and absorb heat. When the temperature of the light-emitting element 111 drops to the second heating condition, multiple third electrodes 132 control the coolant droplet 230 to leave the light-emitting element 111 and move toward the direction of the second through hole 181 until it enters the high-temperature coolant storage region 170 through the second through hole 181. The entire moving track of the coolant droplet 230 is L-shaped.

Figure 6:
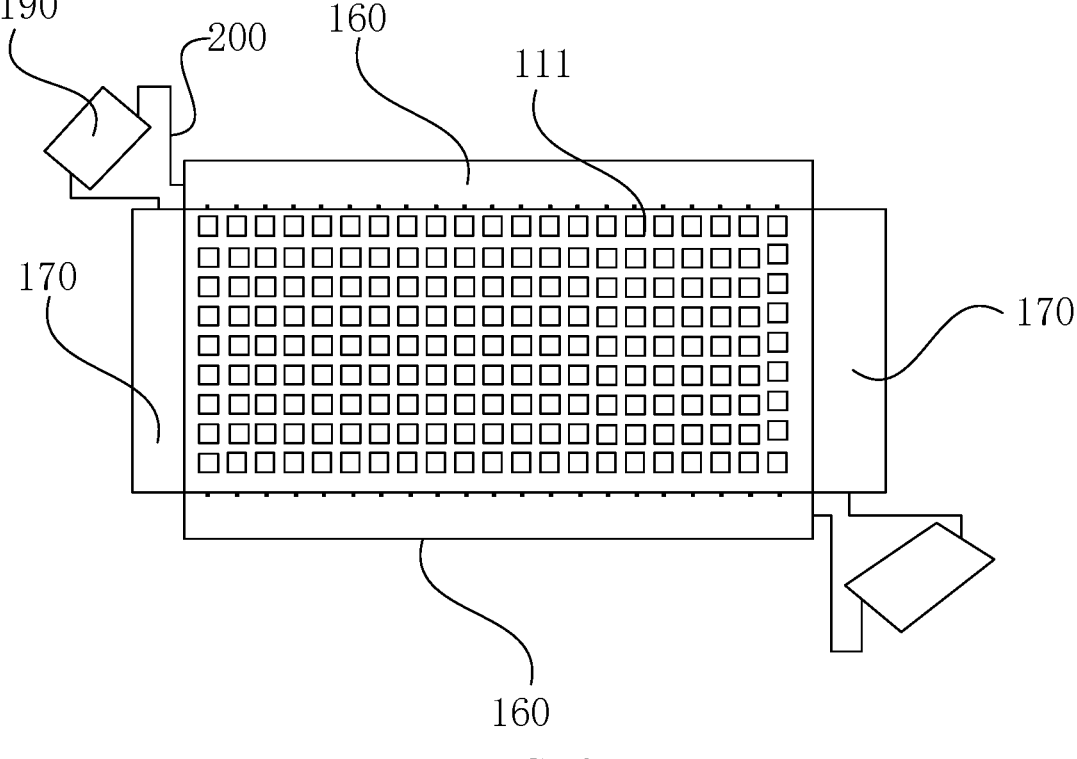
FIG. 6 is a schematic diagram of a fifth embodiment of the heat dissipation structure in the backlight module according to the present application.

In order to improve the recycling efficiency of the coolant droplets 230, this application also designs the coolant storage region, specifically as follows:

FIG. 6 is a top view of a fifth embodiment of the heat dissipation structure in the backlight module of the present application. As shown in FIG. 6, in this application, two oppositely arranged low-temperature coolant storage regions 160 and two oppositely arranged high-temperature coolant storage regions 170 are adopted, and two cooling devices 190 are respectively arranged on the diagonal corners between the high-temperature coolant storage regions 170 and the low-temperature coolant storage regions 160, and further the low-temperature coolant storage region 160 and the high-temperature coolant storage region 170 are connected through cooling pipes 200.

The upper low-temperature coolant storage region 160 is in charge of distributing the coolant droplets 230 for the light emitting units 111 on the upper half. The lower low-temperature coolant storage region 160 is in charge of distributing the coolant droplets 230 for the light-emitting elements 111 on the lower half. The high-temperature coolant storage regions 170 on the left and right sides are in charge of the storage of the heat-saturated coolant droplets 230 on the left and right sides respectively. As such, the cooling efficiency can be further improved.

In addition, in order to better improve the efficiency of the high-temperature coolant storage region 170 circulating the coolant flowing into the low-temperature coolant storage region 160, the number of cooling devices 190 can also be increased. A plurality of cooling devices 190 simultaneously cool down the coolant in the cooling pipe 200, so that the high-temperature coolant can be quickly cooled to the temperature of the coolant that can be recycled again, which can be stored in the low-temperature coolant storage region 160 for cooling, so as to facilitate efficient use of the coolant and realize rapid cooling of the light emitting units 111.

FIG. 7 is a schematic diagram of an operating state at a certain moment during an operating process of the heat dissipation structure of the present application. As shown in FIG. 7, A is the coolant droplet 230 that is moving and that has not reached the heat dissipation position after flowing out of the low-temperature coolant storage region 160; B is a coolant droplet 230 that has arrived at the designated position is absorbing heat at the designated position; C is a coolant drop 230 that has absorbed heat (heat saturated state) at the designated position, and is moving to the high-temperature coolant storage region 170. This driving manner is merely an example, and there may be other types of movement rules, which are not limited therein.

In addition, the heat dissipation structure 120 in this application can also cooperate and work together with a temperature detection device provided on the light board 110. The temperature detection device on the light board 110 monitors the temperature of each partition of the mini LED backlight or each light-emitting element 111, and one or more threshold temperatures may be set for the temperature detection device. When it is detected that the temperature of one or more partitions or a certain light-emitting element 111 exceeds the threshold temperature, an over-temperature signal is fed back to the driver chip 140 of the heat dissipation structure 120, so that the replacement frequency of the coolant at the over-temperature area is accelerated, and the heat dissipation of the over-temperature zone or the light-emitting element 111 is accelerated, thus lowering the temperature, making the temperature of the mini LED uniform, and preventing the local temperature from getting too high.

The temperature detection device can be composed of a temperature detection layer inside the mini LED light board 110. The temperature detection layer includes a plurality of thermistors, and the resistance of the thermistors can change along with the temperature in the backlight module 100, so as to monitor the temperatures in the backlight module 100. It can be understood that the thermistors in the temperature detection layer may be a positive temperature coefficient thermistor (PTC), a negative temperature coefficient thermistor (NTC) or other types of thermistors, which are not specifically limited in this application.

Taking the positive temperature coefficient thermistor as an example, the resistance value of the positive temperature coefficient thermistor increases with the increase of temperature. The detection method of the temperature detection layer is specifically to monitor the temperature of each light emitting unit 111/partition. When the temperature of a light-emitting element 111/partition is overheated, the resistance of the corresponding thermistor in the temperature detection layer increases, and the temperature detection layer amplifies the signal and feeds it back to the driver chip 140 of the heat dissipation structure 120 to control the replacement frequency of the coolant droplet 230 in the over-temperature region. In addition to this, other partition temperature monitoring methods can also be used, such as a global temperature measuring device, and this application merely uses a temperature detecting device as an example for illustration.

Figure 8:
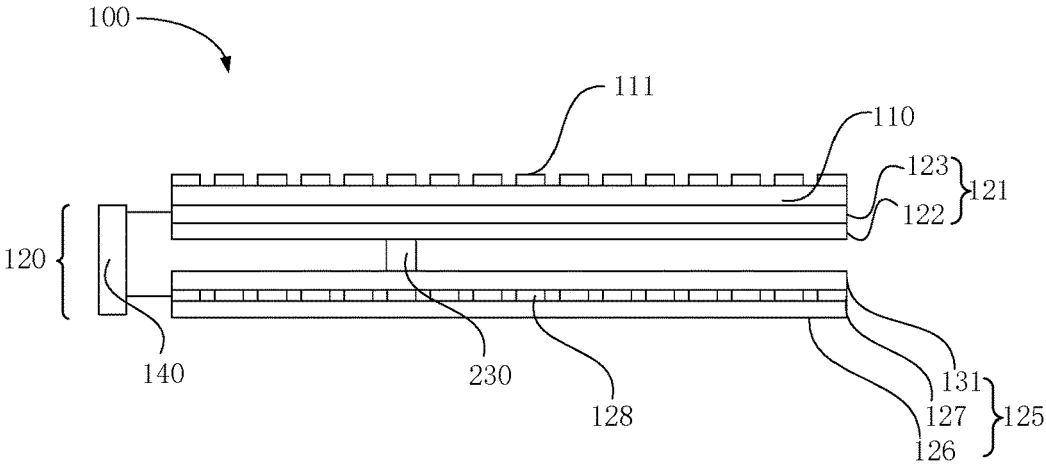
FIG. 8 is a top view of a sixth embodiment of the heat dissipation structure in the backlight module according to the present application.

FIG. 8 is a top view of a sixth embodiment of the heat dissipation structure in the backlight module of the present application. As shown in FIG. 8, a coolant droplet 230 is only placed under the light-emitting element 111 that meets the first heating condition. When the light emitting unit 111 reaches the second heating condition from the first heating condition, there is a voltage difference between each of the plurality of second control electrodes 128 sequentially arranged from the position of the light emitting unit 111 under the second heating condition to the second orientation D2 and the first control electrode layer 123 at equal time intervals.

The difference between this embodiment and the previous embodiment is that this embodiment only has coolant droplets 230 under one or more light-emitting elements 111 that reach a relatively high temperature in a short time for heat dissipation, while there are no coolant droplets 230 under other light-emitting elements 111 that have normal temperatures or have not reached a relatively high temperature, forming a point-to-point and more targeted heat dissipation method.

The specific working principle is as follows. When the backlight module 100 starts to work, the driver chip 140 supplies power to the first control electrode layer 123 and the second control electrode layer 127, and the temperature detection device detects the temperature of each light emitting unit 111 in real time. When the temperature of a light-emitting element 111 reaches the first heating condition, the temperature detection device feeds back a signal to the driver chip 140. After the driver chip 140 receives the signal, it controls the voltage output by timing to drive and change the electrical property of each of the second control electrodes 128 at equal time intervals, so that the coolant droplets 230 flow out from the first through hole 180 of the low-temperature coolant storage region 160, and dissipates heat from the light emitting unit 111 that meets the first heating condition according to a preset flow route. The coolant drop 230 stays at the position of the light emitting unit 111 for a period of time to absorb heat (the staying time can be preset), and after absorbing the heat, it moves to the high temperature coolant storage region 170 according to a preset route. In this way, the allocation of heat dissipation resources can be reasonably optimized, the efficiency of point-to-point targeted heat dissipation can be improved, and the local heat generated by mini LEDs can be quickly cooled in a short period of time.

Figure 9:
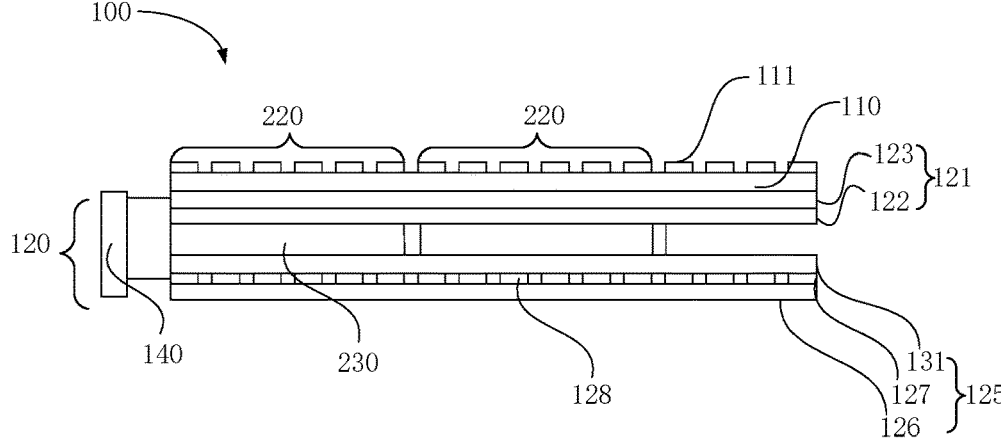
FIG. 9 is a schematic diagram of a seventh embodiment of the heat dissipation structure in the backlight module according to the present application.

FIG. 9 is a schematic diagram of a seventh embodiment of the heat dissipation structure in the backlight module of the present application. As shown in FIG. 9, a plurality of adjacently arranged light-emitting elements 111 form a light-emitting region 220, and a coolant droplet 230 is arranged between each light-emitting region 220 and a plurality of corresponding second control electrodes 128 corresponding to the light-emitting region 220, where the area of the coolant droplet 230 is the same as that of this light emitting region 220. When a light emitting region 220 reaches the second heating condition from the first heating condition, the voltage difference between the first control electrode layer 123 and the second control electrodes 128 under the light emitting region 220 reaching the second heating condition is zero, and the adjacent second control electrodes 128 under the light emitting regions 220 arranged from the first orientation D1 to the second orientation D2 have a voltage difference with the first control electrode layer 123 within the same interval time.

In this embodiment, a plurality of light emitting units 111 are used to form a light emitting region 220, and a coolant droplet 230 is used to dissipate heat from a light emitting region 220, forming local heat dissipation for the partitions of the backlight module 100.

The specific working principle is as follows. When the backlight module 100 starts to work, the driver chip 140 supplies power to the first control electrode layer 123 and the second control electrode layer 127, and controls the voltage output by timing to drive and change the electrical property of each of the second control electrodes 128 at equal time intervals, so that the coolant droplet 230 flows out from the first through hole 180 of the low-temperature coolant storage region 160, and reaches the position underneath each light-emitting region 220 according to the preset flow route. Then the coolant droplet 230 stays at the position of the light emitting region 220 for a period of time to absorb heat (the staying time can be preset, controlled by the timing of the driver chip 140), and the cooling droplet 230 absorbs heat to cool down the light emitting region 220 that meets the first heating condition to the second heating condition, and then moves to the high-temperature coolant storage region 170 according to a preset route. In this way, the temperature uniformity of the backlight can be controlled, local overheating of the backlight can be prevented, and the local heat generated by the mini LED can be quickly cooled in a short period of time.

Figure 10:
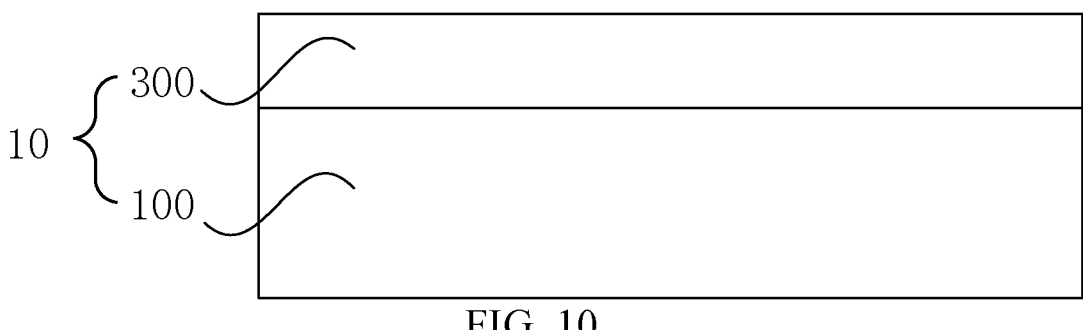
FIG. 10 is a schematic diagram of an embodiment of a display device according to the present application.

FIG. 10 is a schematic diagram of an embodiment of a display device of the present application. As shown in FIG. 10, the present application further discloses a display device 10 including a display panel 300. The display device 10 further includes the above-mentioned backlight module 100, and the display panel 300 is disposed on a side of a light-emitting surface of the backlight module 100. The display panel 300 per se does not emit light, and the backlight module 100 provides a normal light source for the display panel 300 to ensure normal display of the display panel 300.

The display device 10 of the present application can be a device capable of displaying, such as a TV, a computer, a tablet, etc, and the present application does not make specific limitations. However, the backlight module 100 in the display device 10 of the present application is mainly aimed at the backlight module 100 with a mini LED light board 110.

Since the mini LED backlight module 100 includes a large number of micron-scale light-emitting elements 111, for a mini LED with multiple partitions, when the display panel 300 turns on HDR, the powers of the light-emitting elements 111 will be different between different partitions, which will lead to a huge difference in the heat production between different zones. In particular, the heat accumulation in a high-brightness display area is more, and the heat accumulation in a low-brightness area is less, which will lead to uneven temperature of the entire light board 110, and long-term use will easily reduce the lifespan of the light emitting units 111 in local areas, and may also cause abnormal display of the display panel 300.

In view of the above problems, the present application improves the backlight module 100 in the display device 10. In this application, a heat dissipation structure 120 is disposed under the light board 110 in the backlight module 100, and the first control layer 121 and the second control layer 125 of the heat dissipation structure 120 are used to control the movement of the coolant droplet 230 located between the first control layer 121 and the second control layer 125. When the light-emitting element 111 satisfies the first heating condition, the first control layer 121 and the second control layer 125 control the coolant droplet 230 to move under the light-emitting element 111. At this time, the coolant droplet 230 will absorb the heat generated by the light emitting unit 111, and reduce the temperature of the light emitting unit 111 to the second heating condition. When the light emitting unit 111 satisfies the second heating condition, the first control layer 121 and the second control layer 125 control the coolant droplet 230 to leave under the light emitting unit 111, and the heat is taken away by the coolant droplet 230. In this way, it is possible to dissipate heat from the light-emitting element 111 by controlling the stay or replenishment of coolant droplet 230 under the high-heat-generating light-emitting element 111, which can control the temperature uniformity of the backlight, prevent local overheating of the backlight, and quickly cool down the local heat generated by the mini LED in a short period of time, further improving the quality of the display device 10, and prolonging the service life of the display device 10.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, and shall all be regarded as falling in the scope of protection of this application.

What is claimed is:

1. A backlight module, comprising a light board and a heat dissipation structure, wherein a plurality of light-emitting elements are arranged in a matrix on the light board, and wherein the heat dissipation structure is arranged on a side of the light board facing away from the plurality of light-emitting elements;

wherein the heat dissipation structure comprises a first control layer and a second control layer, wherein the first control layer is arranged on the side of the light board facing away from the plurality of light-emitting elements and is disposed opposite to the second control layer, and wherein there is defined a gap between the first control layer and the second control layer, and there is disposed a coolant droplet in the gap;

wherein when a light-emitting element satisfies a first heating condition, the first control layer and the second control layer are configured to control the coolant droplet to move to a position underneath the light-emitting element; when the light-emitting element satisfies a second heating condition, the first control layer and the second control layer are configured to control the coolant droplet to leave the position underneath the light-emitting element;

wherein the heat dissipation structure further comprises a low-temperature coolant storage region and a high-temperature coolant storage region; the low-temperature coolant storage region is configured to store a coolant that has not absorbed the heat of the light-emitting element; the high-temperature coolant storage region is configured to store a coolant that has absorbed the heat of the light-emitting element;

the low-temperature coolant storage region defines a plurality of first through holes corresponding to the gap between the first control layer and the second control layer, and the high-temperature coolant storage region defines a plurality of second through holes corresponding to the gap between the first control layer and the second control layer;

an orientation in which the low-temperature coolant storage region is located is a first orientation, and an orientation where the high-temperature coolant storage region is located is a second orientation; and the first control electrode layer and the second control electrode layer are configured to control the coolant droplet to move from the first orientation to the second orientation;

wherein the second control layer comprises a second control electrode layer, the second control electrode layer comprises a plurality of second control electrodes; the plurality of second control electrodes further comprises a plurality of first electrodes and a plurality of second electrodes, wherein the plurality of first electrodes are arranged in the low-temperature coolant storage region at a position adjacent to each first through hole, and wherein the plurality of second electrodes are arranged in the high-temperature coolant storage region at a position adjacent to each second through hole;

an orthographic projection of the first control electrode layer in a direction perpendicular to the substrate covers orthographic projections of the plurality of first electrodes and the plurality of second electrodes in the direction perpendicular to the substrate;

by changing the electrical properties of the plurality of first electrodes, at the position of the first through hole, the coolant that has not absorbed the heat of the light emitting element is divided, so that the coolant that has not absorbed the heat of the light emitting element flows out in the form of droplets;

by changing the electrical properties of the plurality of second electrodes, at the position of the second through hole, the coolant droplet flowing toward the high-temperature coolant storage region enters the second through hole.

2. The backlight module as recited in claim 1, wherein the first control layer comprises a first hydrophobic layer and a first control electrode layer that are stacked in sequence, wherein the second control layer comprises a substrate, the second control electrode layer, and a second hydrophobic layer that are stacked in sequence; wherein each of the plurality of second control electrodes is disposed corresponding to a position of the respective light-emitting element;

wherein when a voltage difference is formed between each second control electrode and the first control electrode layer, the first hydrophobic layer and the second hydrophobic layer are both hydrophilic at positions corresponding to the second control electrode, and wherein when a zero voltage difference is formed between each second control electrode and the first control electrode layer, the first hydrophobic layer and the second hydrophobic layer are both hydrophobic at positions corresponding to the second control electrode.

3. The backlight module as recited in claim 2, wherein each of the plurality of second control electrodes has a shape of a square, a circle or a rhombus.

4. The backlight module as recited in claim 2, wherein the heat dissipation structure further comprises a cooling device; wherein the low-temperature coolant storage region and the high-temperature coolant storage region are respectively arranged on different sides of an entirety of the first control layer and second control layer; wherein the low-temperature coolant storage region, the high-temperature coolant storage region, and the cooling device are connected by cooling pipes; wherein the cooling pipes are equipped with a one-way valve to control a flow of a coolant in the high-temperature cooling storage region to the low-temperature coolant storage region;

wherein and wherein a position of each of the plurality of first through holes and a position of each of the plurality of second through holes each correspond to a position of the second control electrode in the respective row or column.

5. The backlight module as recited in claim 4, wherein diameters of each first through hole and each second through hole each lie in the range from 50 um to 100 um.

6. The backlight module as recited in claim 4, wherein there is disposed the coolant droplet between each of the second control electrodes and the respective light-emitting element;

wherein when a light-emitting element reaches the second heat-generating condition from the first heat-generating condition, the voltage difference between the first control electrode layer and the second control electrode underneath the light-emitting element meeting the second heat-generating condition is zero, and wherein there is generated a voltage difference between each of the adjacent plurality of second control electrodes arranged sequentially from the first orientation to the second orientation and the first control electrode layer at equal time intervals.

7. The backlight module as recited in claim 4, wherein there is disposed a coolant droplet only under each light-emitting element satisfying the first heating condition;

wherein when the light-emitting element reaches the second heat-generating condition from the first heat-generating condition, there is generated a voltage difference between each of the plurality of second control electrodes arranged sequentially from a position of the light-emitting element satisfying the second heating condition to the second orientation and the first control electrode layer at equal time intervals.

8. The backlight module as recited in claim 4, wherein a plurality of adjacently arranged light-emitting elements form one light-emitting region, and there is disposed a coolant droplet between each light-emitting region and the plurality of second control electrodes corresponding to the light-emitting region, wherein an area of the coolant droplet is equal to an area of the light-emitting region;

wherein when one of the light emitting regions reaches the second heating condition from the first heating condition, the voltage difference between the first control electrode layer and the second control electrodes under the light emitting region reaching the second heating condition is zero, and there is generated a voltage difference between the second control electrodes under each of the adjacent light-emitting regions sequentially arranged from the first orientation to the second orientation at equal time intervals.

9. The backlight module as recited in claim 4, wherein there are two low-temperature coolant storage regions, two high-temperature coolant storage regions, wherein the two low-temperature coolant storage regions are arranged opposite to each other, and the two high-temperature coolant storage regions are arranged opposite to each other.

10. The backlight module as recited in claim 9, wherein there are two cooling devices respectively arranged on two diagonal corners between the high-temperature coolant storage regions and the low-temperature coolant storage regions, wherein the low-temperature coolant storage regions and the high-temperature coolant storage region are connected together through cooling pipes.

11. The backlight module as recited in claim 4, wherein there are disposed a plurality of cooling devices configured to simultaneously cool down the coolant in the cooling pipes.

12. The backlight module as recited in claim 4, wherein an area of the coolant droplet is equal to an area of the light-emitting element.

13. The backlight module as recited in claim 1, wherein the low-temperature coolant storage region and the high-temperature coolant storage region are arranged adjacently, and the plurality of second control electrodes further comprise a plurality of third electrodes disposed above the substrate, wherein the plurality of third electrodes are arranged in an L shape between the first electrodes and the second electrodes.

14. The backlight module as recited in claim 1, wherein the low-temperature coolant storage region and the high-temperature coolant storage region are oppositely arranged, and the plurality of second control electrodes further comprise a plurality of third electrodes disposed above the substrate, wherein the plurality of third electrodes are arranged in a straight line between the first electrodes and the second electrodes.

15. The backlight module as recited in claim 1, further comprising a supporting column arranged between the first hydrophobic layer and the second hydrophobic layer, wherein one end of the support column abuts against the first hydrophobic layer, and another end of the support column abuts against the second hydrophobic layer, wherein the support column is operative to support the first hydrophobic layer and the second hydrophobic layer to define a gap therebetween.

16. The backlight module as recited in claim 15, wherein the supporting column is made of a polymer material.

17. The backlight module as recited in claim 1, wherein the heat dissipation structure further comprises a temperature detection device configured to monitor a temperature of each of the plurality of light-emitting elements.

18. The backlight module as recited in claim 17, wherein the temperature detection device is set with one or more threshold temperatures, and wherein in response to detecting that the temperature of one of the light-emitting elements exceeds the threshold temperature, an over-temperature signal is fed back to a driver chip.

19. A display device, comprising a display panel and a backlight module, wherein the display panel is arranged on a side of a light emitting surface of the backlight module; wherein the backlight module comprises a light board and a heat dissipation structure, wherein a plurality of light-emitting elements are arranged in a matrix on the light board, and wherein the heat dissipation structure is arranged on a side of the light board facing away from the plurality of light-emitting elements;

wherein the heat dissipation structure comprises a first control layer and a second control layer, wherein the first control layer is arranged on the side of the light board facing away from the plurality of light-emitting elements and is disposed opposite to the second control layer, and wherein there is defined a gap between the first control layer and the second control layer, and there is disposed a coolant droplet in the gap;

wherein when a light-emitting element satisfies a first heating condition, the first control layer and the second control layer are configured to control the coolant droplet to move to a position underneath the light-emitting element; when the light-emitting element satisfies a second heating condition, the first control layer and the second control layer are configured to control the coolant droplet to leave the position underneath the light-emitting element;

wherein the heat dissipation structure further comprises a low-temperature coolant storage region and a high-temperature coolant storage region; the low-temperature coolant storage region is configured to store a coolant that has not absorbed the heat of the light-emitting element; the high-temperature coolant storage region is configured to store a coolant that has absorbed the heat of the light-emitting element;

the low-temperature coolant storage region defines a plurality of first through holes corresponding to the gap between the first control layer and the second control layer, and the high-temperature coolant storage region defines a plurality of second through holes corresponding to the gap between the first control layer and the second control layer;

an orientation in which the low-temperature coolant storage region is located is a first orientation, and an orientation where the high-temperature coolant storage region is located is a second orientation; and the first control electrode layer and the second control electrode layer are configured to control the coolant droplet to move from the first orientation to the second orientation;

wherein the second control layer comprises a second control electrode layer, the second control electrode layer comprises a plurality of second control electrodes; the plurality of second control electrodes further comprises a plurality of first electrodes and a plurality of second electrodes, wherein the plurality of first electrodes are arranged in the low-temperature coolant storage region at a position adjacent to each first through hole, and wherein the plurality of second electrodes are arranged in the high-temperature coolant storage region at a position adjacent to each second through hole;

an orthographic projection of the first control electrode layer in a direction perpendicular to the substrate covers orthographic projections of the plurality of first electrodes and the plurality of second electrodes in the direction perpendicular to the substrate;

by changing the electrical properties of the plurality of first electrodes, at the position of the first through hole, the coolant that has not absorbed the heat of the light emitting element is divided, so that the coolant that has not absorbed the heat of the light emitting element flows out in the form of droplets;

by changing the electrical properties of the plurality of second electrodes, at the position of the second through hole, the coolant droplet flowing toward the high-temperature coolant storage region enters the second through hole.

* * * * *